(12) United States Patent
Schmidt et al.

(10) Patent No.: US 11,041,122 B2
(45) Date of Patent: Jun. 22, 2021

(54) WAVELENGTH CONVERTING MATERIAL FOR A LIGHT EMITTING DEVICE

(71) Applicant: Lumileds LLC, San Jose, CA (US)

(72) Inventors: Peter Josef Schmidt, Aachen (DE); Dajana Durach, Aachen (DE); Wolfgang Schnick, Gauting (DE)

(73) Assignee: Lumileds LLC, San Jose, CA (US)

(*) Notice: Subject to any disclaimer, the term of this patent is extended or adjusted under 35 U.S.C. 154(b) by 193 days.

(21) Appl. No.: 16/079,412

(22) PCT Filed: Feb. 21, 2017

(86) PCT No.: PCT/EP2017/053844
§ 371 (c)(1),
(2) Date: Aug. 23, 2018

(87) PCT Pub. No.: WO2017/144433
PCT Pub. Date: Aug. 31, 2017

(65) Prior Publication Data
US 2019/0010395 A1    Jan. 10, 2019

(30) Foreign Application Priority Data
Feb. 23, 2016 (EP) ..................... 16156887

(51) Int. Cl.
*C09K 11/77* (2006.01)
*H01L 33/50* (2010.01)
(Continued)

(52) U.S. Cl.
CPC ...... *C09K 11/7792* (2013.01); *C09K 11/7706* (2013.01); *C09K 11/7721* (2013.01);
(Continued)

(58) Field of Classification Search
CPC ............ C09K 11/7734; C09K 11/7774; C09K 11/7792; C09K 11/7721; C09K 11/7706;
(Continued)

(56) References Cited

U.S. PATENT DOCUMENTS 6,967,330 B1   11/2005   Lempicki et al.
8,471,459 B2   6/2013    Kato et al.
(Continued)

FOREIGN PATENT DOCUMENTS

CN   101842461 A   9/2010
CN   101920198 A   12/2010
(Continued)

OTHER PUBLICATIONS

The extended European Search Report corresponding to EP application No. 16156887.8, dated Jul. 12, 2016, 9 pages.
(Continued)

*Primary Examiner* — Matthew E. Hoban
*Assistant Examiner* — Lynne Edmondson

(57) ABSTRACT

Embodiments of the invention include a wavelength-converting composition as defined by $R_{3-x-y-z}A_{x+y}M_zSi_{6-w1}Al_{w1}O_{3x+y+w1}N_{11-7x/3-y-w1}\square_{2-2x/3}$, with $\square$ being vacancies of the structure that are filled by oxygen atoms with $0<x\leq 3$, $-3\leq y<3$, $0<z<1$, $0\leq w1\leq 6$, $0\leq x+y$, $x+y+z\leq 3$, $11-7/3x-y-w1\leq 0$, and $3x+y+w1\leq 13$. R is selected from the group comprising trivalent La, Gd, Tb, Y, Lu; A is selected from the group comprising bivalent Ca, Mg, Sr, Ba, and Eu; and M is selected from the group comprising trivalent Ce, Pr and Sm.

9 Claims, 3 Drawing Sheets

(51) Int. Cl.
*C01F 17/30* (2020.01)
*H01L 33/32* (2010.01)

(52) U.S. Cl.
CPC ........ *C09K 11/7774* (2013.01); *H01L 33/502* (2013.01); *H01L 33/504* (2013.01); *C01F 17/30* (2020.01); *H01L 33/32* (2013.01)

(58) Field of Classification Search
CPC ............ C09K 11/0838; C09K 11/7728; C09K 11/7783; H01L 33/502; H01L 33/504
See application file for complete search history.

(56) References Cited

U.S. PATENT DOCUMENTS

| | | |
|---|---|---|
| 8,512,522 B2 | 8/2013 | Li et al. |
| 8,535,566 B2 | 9/2013 | Li et al. |
| 8,551,360 B2 | 10/2013 | Duan et al. |
| 8,597,545 B1 | 12/2013 | Liu et al. |
| 8,992,797 B2 | 3/2015 | Seto et al. |
| 2013/0234588 A1* | 9/2013 | Seto ............... C09K 11/7706 313/503 |
| 2015/0329939 A1 | 11/2015 | Coffin et al. |

FOREIGN PATENT DOCUMENTS

| | | |
|---|---|---|
| CN | 102399556 A | 4/2012 |
| CN | 102917978 A | 2/2013 |
| CN | 103155707 A | 6/2013 |
| CN | 103254900 A | 8/2013 |
| WO | 2009/050171 A2 | 4/2009 |
| WO | 2010/114061 A1 | 10/2010 |

OTHER PUBLICATIONS

From the EPO as the ISA, Notification of Transmittal of the International Search Report and the Written Opinion of the ISA corresponding to PCT/EP2017/053844, dated Mar. 31, 2017, 14 pages.

* cited by examiner

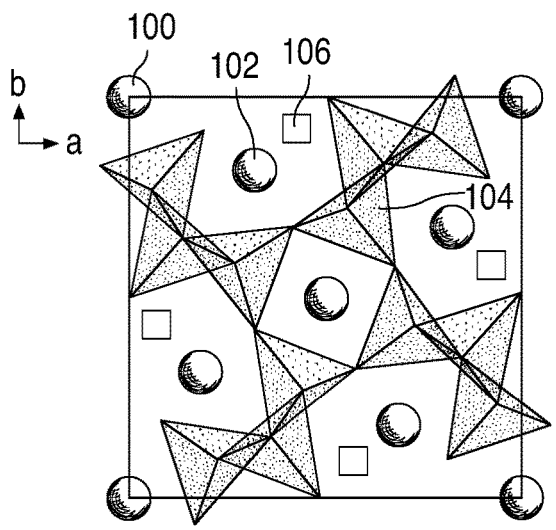
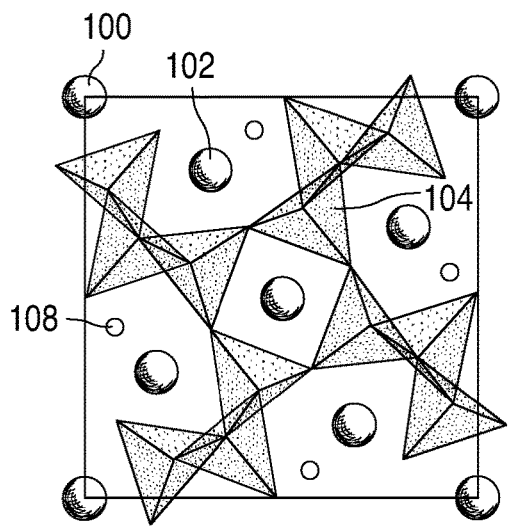
FIG. 1A  FIG. 1B
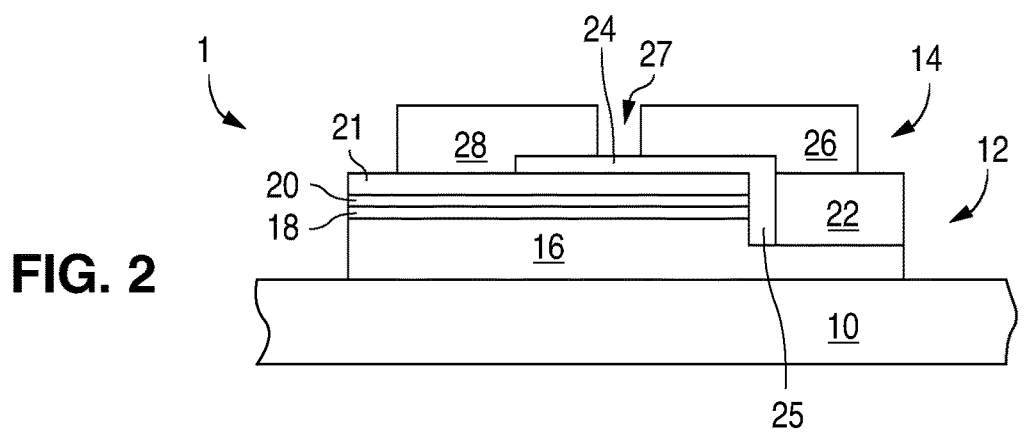
FIG. 2
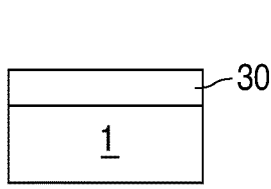  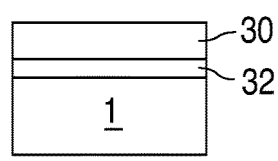  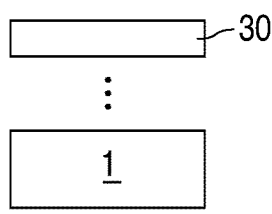
FIG. 3  FIG. 4  FIG. 5

WAVELENGTH CONVERTING MATERIAL FOR A LIGHT EMITTING DEVICE

FIELD OF THE INVENTION

The invention relates to a wavelength converting material as well as a light emitting device with such wavelength converting material.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

A light emitting device such as an LED is often combined with a wavelength converting material such as a phosphor. US 2013/0234588 describes "a new phosphor [with a] red light component and . . . a large full width at half maximum." (Abstract.) Paragraph 20 of US 2013/0234588 teaches "a phosphor including a crystal phase represented by the formula [I] . . . $R_{3-x-y-z+w2}M_zA_{1.5x+y-w2}Si_{6-w1-w2}Al_{w1+w2}O_{y+w1}N_{11-y-w1}$ [I]. (In the formula [I], R represents at least one kind of a rare-earth element selected from the group consisting of La, Gd, Lu, Y and Sc, M represents at least one kind of a metal element selected from the group consisting of Ce, Eu, Mn, Yb, Pr and Tb, A represents at least one kind of a bivalent metal element selected from the group consisting of Ba, Sr, Ca, Mg and Zn, and x, y, z, w1 and w2 are the numeric values in the following ranges: $(1/7) \leq (3-x-y-z+w2)/6 < (1/2)$, $0 < (1.5x+y-w2)/6 < (9/2)$, $0 < x < 3$, $0 \leq y \leq 2$, $0 < z < 1$, $\leq w1 \leq 5$, $0 \leq w2 \leq 5$, and $0 \leq w1 + w2 \leq 5.$)."

Paragraph 97 of US 2013/0234588 teaches "in the above-mentioned fundamental system of the crystal phase, a part of Si may be substituted with Al. This is why Al is appeared in the general formula [I]. In that case, N-anions are substituted with O-anions, and/or bivalent A is substituted with trivalent R.".

WO 2009/050171 describes a method of manufacturing a rare-earth doped alkaline-earth silicon nitride phosphor of a stoichiometric composition. Said method comprising the step of selecting one or more compounds each comprising at least one element of the group comprising the rare-earth elements (RE), the alkaline-earth elements (AE), silicon (Si) and nitrogen (N) and together comprising the necessary elements to form the rare-earth doped alkaline-earth silicon nitride phosphor ($AE_2Si_5N_8:RE$). The method further comprises the step of bringing the compounds at an elevated temperature in reaction for forming the rare-earth doped alkaline-earth silicon nitride phosphor ($AE_2Si_5N_8:RE$). In such a method normally a small amount of oxygen, whether intentionally or not-intentionally added, will be incorporated in the rare-earth doped alkaline-earth silicon nitride phosphor ($AE_2Si_5N_8:RE$). According to the invention the creation of defects by formation of a non-stoichiometric oxygen containing phosphor is at least partly prevented by partly substituting for the ions (AE, Si, N) of the alkaline-earth silicon nitride phosphor ($AE_2Si_5N_8:RE$) suitable further elements of the periodic system by which vacancies are created, filled or annihilated resulting in the formation of a modified alkaline-earth silicon nitride phosphor ($AE_2Si_5N_8:RE$) having a stoichiometric composition. In this way a modified phosphor is obtained having excellent and stable optical properties. The invention further relates to a modified phosphor obtainable by the above-mentioned method and a radiation converting device comprising such a phosphor.

SUMMARY OF THE INVENTION

In a first aspect, a wavelength converting material is provided, the wavelength converting material comprising $R_{3-x-y-z}A_{x+y}M_zSi_{6-w1}Al_{w1}O_{3x+y+w1}N_{11-7/3-y-w1}\square_{2-2x/3}$, wherein:

the material comprises a crystal lattice;
$\square$ comprises a vacancy on the crystal lattice;
$0 < x \leq 3$;
$-3 \leq y < 3$;
$0 < z < 1$;
$0 \leq w1 \leq 6$;
$0 \leq x+y, x+y+z \leq 3$;
$11 - 7/3x - y - w1 \geq 0$;
$3x + y + w1 \leq 13$;
R is selected from the group trivalent La, Gd, Tb, Y, and Lu;
A is selected from the group bivalent Ca, Mg, Sr, Ba, and Eu;
M is selected from the group trivalent Ce, Pr and Sm;
at least one of the vacancies is occupied by an O atom,
wherein [La]>0,
wherein [Ca]>0,
wherein $0 \leq [Eu] \leq 0.01$, and
wherein $([La]+[Ca]+[Ce]+[Eu])/[Si] \leq 0.52$
as further also defined in the accompanying claims.

In a further aspect, a device is provided, the device comprising: a light emitting diode that emits one or more of UV and blue light, especially (at least) blue light; and a wavelength converting material as described herein disposed in a path of the (blue) light.

BRIEF DESCRIPTION OF THE DRAWINGS

FIGS. 1A and 1B illustrate the crystal structures of materials with vacancies and with vacancies filled with oxygen atoms.

FIG. 2 is a cross sectional view of an LED.

FIG. 3 is a cross sectional view of a device with a wavelength converting structure in direct contact with an LED.

FIG. 4 is a cross sectional view of a device with a wavelength converting structure in close proximity to an LED.

FIG. 5 is a cross sectional view of a device with a wavelength converting structure spaced apart from an LED.

DETAILED DESCRIPTION

Figure 6:
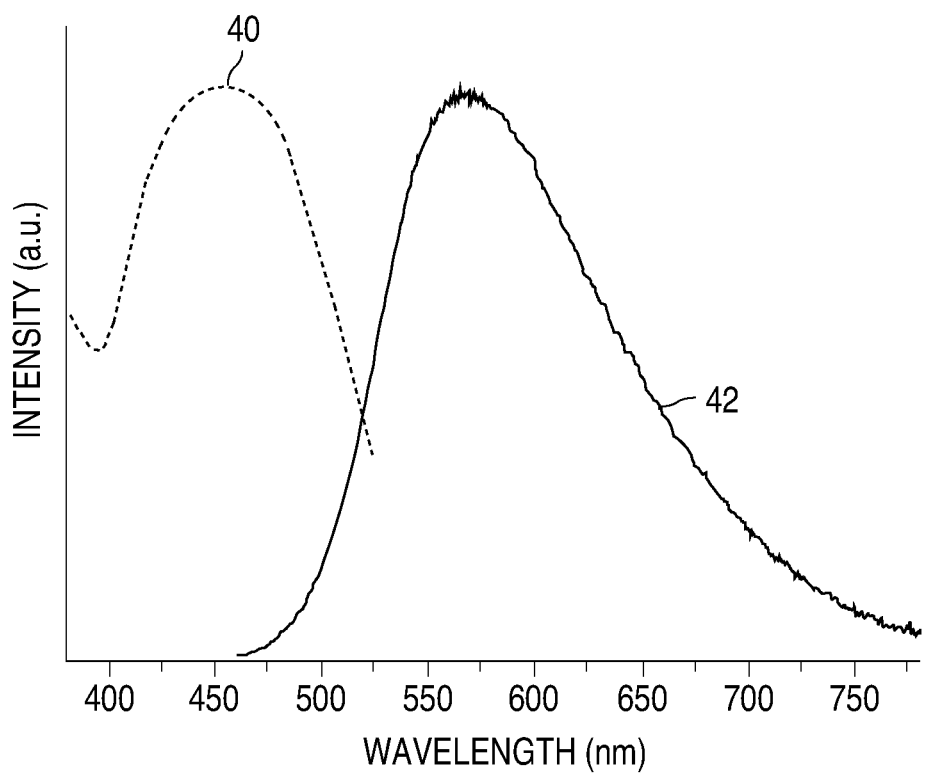
FIGS. 6, 7, 8, and 9 illustrate excitation and emission spectra for materials according to embodiments of the invention.

In the general formula [I] of the material described in US 2013/0234588, A represents a bivalent metal like Ca that is introduced into the tetragonal crystal lattice in such a way that 1.5 bivalent A atoms replace one trivalent R atom. As a result, the number of large cations (of type R, M, and A), divided by the number of small host lattice cations (Si and Al), is larger than 0.5. Other substitutions as defined by formula [I], such as replacement of R,N pairs by A,O pairs, or replacement of Si,N pairs by Al,O pairs, do not change this ratio. In a case where no additional space in the host lattice is available to accommodate the extra A atoms, the prior art phosphors as defined by formula [I] most likely show an atom deficit in the host lattice backbone, such as a partial removal of Si or Al and N or O atoms. Oxygen free nitridosilicate samples of composition $Ca_{1.5x}La_{2.9-x}Si_6N_{11}$:$Ce_{0.1}$ as described in US 2013/0234588 thus show a cell volume expansion from x=0 (V=502.78 Å$^3$) to x=2 (V=504.45 Å$^3$), which points towards a more loose bonding within the host lattice.

Embodiments of the invention include yellow to red emitting $Ce^{3+}$ and/or $Eu^{2+}$ doped materials with host lattices showing a tetragonal structure that can be derived from the $Ce_3Si_6N_{11}$ structure type. The inventors observed that the structure contains vacancies in the anion sublattice that can be filled with additional oxygen atoms to increase the rigidity of the host lattice. A more rigid host lattice is beneficial to increase the conversion efficiency of a phosphor system in a phosphor-converted LED system as discussed in non-patent literature J. Brgoch, S. P. DenBaars, R. Seshadri, J. Phys. Chem. C 117 (2013) 17955-17959.

Embodiments of the invention include a wavelength-converting composition as defined by the following formula [II]: $R_{3-x-y-z}A_{x+y}M_zSi_{6-w1}Al_{w1}O_{3x+y+w1}N_{11-7x/3-y-w1}\square_{2-2x/3}$, with $\square$ being vacancies of the structure that are filled by oxygen atoms, and with $0 < x \leq 3$, $-3 \leq y < 3$, $0 < z < 1$, $0 \leq w1 \leq 6$, $0 \leq x+y$, $x+y+z \leq 3$, $11-7/3x-y-w1 \leq 0$, and $3x+y+w1 \leq 13$. R is selected from the group comprising trivalent La, Gd, Tb, Y, Lu; A is selected from the group comprising bivalent Ca, Mg, Sr, Ba, and Eu; and M is selected from the group comprising trivalent Ce, Pr and Sm, as further defined in the accompanying claims. The vacancies $\square$ are at different locations in the lattice structure than the oxygen defined by $O_{3x+y+w1}$. If Al replaces Si (parameter w1), then O replaces N for charge compensation. This is known as SiAlON formation; (Si,N)+ is replaced by (Al,O)+. The material may be doped with $Ce^{3+}$ or $Eu^{2+}$. As indicated above, trivalent $Ce^{3+}$ substitutes for trivalent R and the divalent $Eu^{2+}$ substitutes for divalent M.

In some embodiments, the compositions contain divalent A atoms and oxygen atoms on vacancy positions of materials described by formula [I]. FIGS. 1A and 1B show a comparison of two structures. FIG. 1A illustrates the lattice of formula [1] where x, y, z, w1, and w2 are all zero, $R_3Si_6N_{11}\square_2$. FIG. 1B illustrates the lattice of a material according to embodiments of the invention where the vacancies of the material of FIG. 1A are filled by O atoms, $R_3Si_6N_{11}O_2$. In FIGS. 1A and 1B, 100 and 102 are two crystallographic sites that are occupied by R atoms (Wyckoff positions 2a and 4c in the tables 1 and 2). Both sites 100 and 102 can also be occupied by A atoms and the M dopant atoms. Structures 104 are tetrahedra with the Si and Al atoms in the middle (not shown) and the vertices formed by N and O atoms. The vertices that connect three tetrahedra can only be occupied by N atoms; the vertices that connect two tetrahedra can also be occupied by O atoms. Vacancies in FIG. 1A are indicated by squares 106. In FIG. 1B, these vacancies are occupied by O atoms or any other suitable material 108. Some of the vacancies 106 (not shown in FIG. 1B) or all of the vacancies (shown in FIG. 1B, x=3) may be filled by O atoms.

Herein, the term "wavelength converting" may also refer to a plurality of different wavelength converting (all according to the herein indicated formula (II)).

Tables 1 and 2 list, for two embodiments, the crystallographic data that represent the atomic arrangement in the materials unit cell. P4bm is the symbol of the crystallographic space group that describes the symmetry of the crystal lattice according to INTERNATIONAL TABLES FOR CRYSTALLOGRAPHY, Volume A1, SYMMETRY RELATIONS BETWEEN SPACE GROUPS. Eds. H. Wondratscheck and U. Mueller, Kluwer Academic Publishers, Dordrecht (2004). Atom is the species that occupies a lattice site with a specific Wyckoff position (Wyck.) and a site occupation factor (S.O.F.) that is $\leq 1$. For example, site 4c is occupied by 72.9%+2.1% La atoms and 17.1%+7.9% Ca atoms. Headings x/a, y/b and z/c refer to the coordinates of the atomic positions in the crystal lattice that is defined by the lattice constants a, b and c. In the tetragonal lattice system $a=b \neq c$ and all angles between the lattice constants are 90°. La1 in table 1 e.g. sits on the cell corners (x/a=y/b=z/c=0); see the sites labeled 100 in the FIGS. 1A and 1B.

Table 1 shows structural data for an embodiment where half of the vacancies are filled with oxygen atoms $(La_{2.5}Ca_{0.5}Si_6O_{3.5}N_{8.5}\square$, site occupation factor (S.O.F.)=0.5 for site O5). Table 2 shows structural data for an embodiment where all vacancies are filled with oxygen atoms $(La_{1.83}Ca_{1.17}Si_6O_{7.17}N_{5.83}$, S.O.F.=1.0 for site O5). The structure refinement shows that La is being partially replaced by Ca while part of the bridging N2, N3 and N4 atoms are replaced by O. N1 connects three Si atoms and is only occupied by nitrogen. The occupation of the 2B atom sites by La and Ca is due to structural disorder but has no impact on the coordination of the R, A and M type cations.

TABLE 1

Structure data for $La_{2.5}Ca_{0.5}Si_6O_{3.5}N_{8.5}\square$ (space group P4bm, a = b = 10.1505(3) Å, c = 4.8806(2) Å)

| Atom | Wyck. | S.O.F. | x/a | y/b | z/c |
|------|-------|--------|-----|-----|-----|
| La1 | 2a | 1 | 0 | 0 | 0.00000 |
| La2A | 4c | 0.729 | 0.68036 | 0.18036 | 0.02313 |
| Ca2A | 4c | 0.171 | 0.68036 | 0.18036 | 0.02313 |
| La2B | 4c | 0.0209999 | 0.67507 | 0.17507 | 0.20212 |
| Ca2B | 4c | 0.0790005 | 0.67507 | 0.17507 | 0.20212 |
| Si1 | 8d | 1 | 0.20878 | 0.07935 | 0.53496 |
| Si2 | 4c | 1 | 0.11797 | 0.61797 | 0.04469 |
| N1 | 4c | 1 | 0.15171 | 0.65171 | 0.69635 |
| N2/O2 | 8d | 0.72222 | 0.23189 | 0.07442 | 0.18513 |
| N3/O3 | 8d | 0.72222 | 0.07967 | 0.17958 | 0.64119 |
| N4/O4 | 2b | 0.72224 | 0 | ½ | 0.07150 |
| O5 | 4c | 0.5 | 0.57038 | 0.07038 | 0.56876 |

TABLE 2

Structure data for $La_{1.83}Ca_{1.17}Si_6O_{7.17}N_{5.83}$ (space group P4bm, a = b = 10.0881(4) Å, c = 4.9234(2) Å)

| Atom | Wyck. | S.O.F | x/a | y/b | z/c |
|------|-------|-------|-----|-----|-----|
| La1 | 2a | 0.950001 | 0 | 0 | 0.00000 |
| Ca1 | 2a | 0.0499992 | 0 | 0 | 0.00000 |
| La2A | 4c | 0.4 | 0.67943 | 0.17943 | 0.02478 |
| Ca2A | 4c | 0.4 | 0.67943 | 0.17943 | 0.02478 |

TABLE 2-continued

Structure data for $La_{1.83}Ca_{1.17}Si_6O_{7.17}N_{5.83}$ (space group P4bm, a = b = 10.0881(4) Å, c = 4.9234(2) Å)

| Atom | Wyck. | S.O.F | x/a | y/b | z/c |
|---|---|---|---|---|---|
| La2B | 4c | 0.0400009 | 0.67421 | 0.17421 | 0.19843 |
| Ca2B | 4c | 0.16 | 0.67421 | 0.17421 | 0.19843 |
| Si1 | 8d | 1 | 0.20715 | 0.08101 | 0.53557 |
| Si2 | 4c | 1 | 0.11984 | 0.61984 | 0.04474 |
| N1 | 4c | 1 | 0.14968 | 0.64968 | 0.69686 |
| N2/O2 | 8d | 0.42556 | 0.23093 | 0.07593 | 0.18845 |
| N3/O3 | 8d | 0.42556 | 0.07864 | 0.18158 | 0.64139 |
| N4/O4 | 2b | 0.42556 | 0 | ½ | 0.06739 |
| O5 | 4c | 1 | 0.56887 | 0.06887 | 0.56674 |

Examples according to some embodiments include but are not limited to, for example, the compositions $La_{2.48}Ca_{0.5}Si_6O_{3.5}N_{8.5}\square:Ce_{0.02}$ (x=1.5, y=1, z=0.02, w1=0) and $La_{1.8}Ca_{1.17}Si_6O_{7.17}N_{5.83}:Ce_{0.03}$ (x=3, y=−1.83, z=0.03, w1=0). In both materials, ([La]+[Ca]+[Ce])/[Si]=0.5. Materials described in US 2013/0234588 such as $La_{1.71}Ca_{2.2}Si_6O_{0.44}N_{10.56}:Ce_{0.03}$, $La_{1.71}Ca_{2.2}Si_6ON_{10}:Ce_{0.03}$, or $La_{2.37}Ca_{0.75}Si_6O_{0.3}N_{10.7}:Ce_{0.03}$ are significantly Si deficient with ([La]+[Ca]+[Ce])/[Si]=0.66, 0.66 and 0.53 respectively. Accordingly, ([La]+[Ca]+[Ce])/[Si]≤0.52 in some embodiments and ([La]+[Ca]+[Ce])/[Si]≤0.5 in some embodiments.

R is a rare earth metal from the group of La, Gd, Tb, Y, Lu. It is known from non-patent literature M. Woike, W. Jeitschko, Inorg. Chem. 34 (1995) 5105-5108 that the cell volume of tetragonal $Ln_3Si_6N_{11}$ phases decreases from Ln=La to Ce, Pr, Nd and Sm in correlation with the reduction of atomic radii of the lanthanide elements. Partial replacement of R=La by smaller cations (such as, for example, Y, Gd, and Lu) in $R_{3-x-y-z}A_{x+y}M_zSi_{6-w1}Al_{w1}O_{3x+y+w1}N_{11-7x/3-y-w1}\square_{2-2x/3}$ also leads to a cell volume reduction and to a spectral red shift of absorption and emission of the M dopant ions due to a shortening of the M-(O,N) contact lengths and a decrease of the energetic position of the $4f^{n-1}5d^1$ levels of the M atoms relative to the $4f^n 5d^0$ ground state. For example, in some embodiments, the $Ce^{3+}$ emission maximum may shift from 530 nm to 580 nm (red shift=50 nm), and the $Eu^{2+}$ emission maximum may shift from 600 to 650 nm (red shift=50 nm). In one example, replacement of ~40% of $La^{3+}$ (effective ionic radius for coordination number 8=130 pm) by smaller $Y^{3+}$ (effective ionic radius for coordination number 8=116 pm) leads to a cell volume reduction of ~0.6% and a spectroscopic red shift of the emission peak by ~13 nm. In some embodiments, Y and/or Lu substitutes for no more than 50% La. In particular, in some embodiments, $R=La_a(Y_bLu_{1-b})_{1-a}$, where a≥0.5, 0≤b≤1; in some embodiments $R=La_aY_{1-a}$, where a ≥0.5; in some embodiments, $R=La_aLu_{1-a}$, where a ≥0.5. A is a divalent metal that partially or complete replaces trivalent R atoms on their lattice sites. While Ca(II) is about the same size as La(III), atoms like Sr(II) are larger and can help stabilize the introduction of smaller trivalent R atoms like Y(III) or Lu(III). $Y_{2.49}Sr_{0.5}S_6O_{3.5}N_{8.5}\square:Ce_{0.01}$ is an example of such a composition. The size difference of $Sr^{2+}$ and $Ca^{2+}$ is identical with that of $La^{3+}$ and $Y^{3+}$ (effective ionic radius for coordination number 8=140 pm for $Sr^{2+}$ and 126 pm for $Ca^{2+}$). Based on the different ionic sizes, in some embodiments, 100% La can be replaced by 50% Sr and 50% Y. Due to the different sizes the smaller ion (for example, $Y^{3+}$) should preferably occupy the 2A position. In particular, in some embodiments, $R=Y_{0.5}Sr_{0.5}$. Al can be substituted for Si in the same way as known for e.g. the SiAlON material $Nd_3Si_5AlON_{10}$ described by R. Lauterbach, W. Schnick, Z. anorg. allg. Chem. 626 (2000) 56-61, that is isotypic with the corresponding $Ln_3Si_6N_{11}$ nitridosilicates. Part of Si is replaced by Al while the introduced charge can be compensated by either replacing a bridging N[2] by O or by replacing a trivalent R atom by a bivalent A atom, such that SiAlON is formed. Examples are e.g. $La_{2.48}Ca_{0.5}Si_5AlO_{4.5}N_{8.5}\square:Ce_{0.02}$ or $La_{1.48}Ca_{1.5}Si_5AlO_{3.5}N_{8.5}\square:Ce_{0.02}$. SiAlON formation leads to an expansion of the lattice due to the introduction of longer Al—O contacts for shorter Si—N contacts and mainly to a broadening of the phosphor emission due to inhomogeneous broadening introduced by multiple chemical surroundings of the activator sites. Spectral broadening can be especially useful to improve the color rendition of wavelength converted light emitting devices, including wavelength converting materials according to some embodiments of the invention. No more than 5% of Si is replaced by Al in some embodiments (w1<0.3) and no more than 2% of Si is replaced by Al in some embodiments (w1<0.12). In some embodiments, the emission band may broaden by about 2 nm for every % Al substituted for Si. A small amount of Al may be beneficial for compensating excessive oxygen and/or to promote sintering of dense ceramic samples. One effect of vacancy filling in $R_{3-x-y-z}A_{x+y}M_zSi_{6-w1}Al_{w1}O_{3x+y+w1}N_{11-7x/3-y-w1}\square_{2-2x/3}$ is a spectral red shift of absorption and emission bands. Without limiting embodiments of the invention to any particular theory, one possible explanation is additional coordination of M activators on R2 metal positions by oxygen may lead to an increased nexphelauxetic effect causing a spectroscopic red shift. By replacing ~17% of La by Ca and filling half of the vacancies with O, a red shift of the emission of 15 nm was observed. By replacing ~33% of La by Ca and fill all the vacancies with O, a further red shift by ~15 nm of the emission was observed, while the absorption bands shift only by a few nm.

The wavelength converting materials described above may be used, for example, in a light source including a light emitting diode. Light emitted by the light emitting diode is absorbed by the wavelength converting material according to embodiments of the invention and emitted at a different wavelength. FIG. 2 illustrates one example of a suitable light emitting diode, a III-nitride LED that emits blue light.

Though in the example below the semiconductor light emitting device is a III-nitride LED that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

FIG. 2 illustrates a III-nitride LED 1 that may be used in embodiments of the present invention. Any suitable semiconductor light emitting device may be used and embodiments of the invention are not limited to the device illustrated in FIG. 2. The device of FIG. 2 is formed by growing a III-nitride semiconductor structure on a growth substrate 10 as is known in the art. The growth substrate is often sapphire but may be any suitable substrate such as, for example, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple n-contact vias may be formed; the n- and p-contacts 22 and 21 are not limited to the arrangement illustrated in FIG. 2. The n- and p-contacts may be redistributed to form bond pads with a dielectric/metal stack, as is known in the art.

In order to form electrical connections to the LED 1, one or more interconnects 26 and 28 are formed on or electrically connected to the n- and p-contacts 22 and 21. Interconnect 26 is electrically connected to n-contact 22 in FIG. 5. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure.

The substrate 10 may be thinned or entirely removed. In some embodiments, the surface of substrate 10 exposed by thinning is patterned, textured, or roughened to improve light extraction.

Any suitable light emitting device may be used in light sources according to embodiments of the invention. The invention is not limited to the particular LED illustrated in FIG. 2. The light source, such as, for example, the LED illustrated in FIG. 2, is illustrated in the following figures by block 1.

FIGS. 3, 4, and 5 illustrate devices that combine an LED 1 and a wavelength converting structure 30. The wavelength converting structure may contain one of the wavelength converting materials described above.

In FIG. 3, the wavelength converting structure 30 is directly connected to the LED 1. For example, the wavelength converting structure may be directly connected to the substrate 10 illustrated in FIG. 2, or to the semiconductor structure, if the substrate 10 is removed.

In FIG. 4, the wavelength converting structure 30 is disposed in close proximity to LED 1, but not directly connected to the LED 1. For example, the wavelength converting structure 30 may be separated from LED 1 by an adhesive layer 32, a small air gap, or any other suitable structure. The spacing between LED 1 and the wavelength converting structure 30 may be, for example, less than 500 µm in some embodiments.

In FIG. 5, the wavelength converting structure 30 is spaced apart from LED 1. The spacing between LED 1 and the wavelength converting structure 30 may be, for example, on the order of millimeters in some embodiments. Such a device may be referred to as a "remote phosphor" device. Remote phosphor arrangements may be used, for example, in backlights for displays.

The wavelength converting structure 30 may be square, rectangular, polygonal, hexagonal, circular, or any other suitable shape. The wavelength converting structure may be the same size as LED 1, larger than LED 1, or smaller than LED 1.

Wavelength converting structure 30 may be any suitable structure. Wavelength converting structure 30 may be formed separately from LED 1, or formed in situ with LED 1.

Examples of wavelength converting structures that are formed separately from LED 1 include ceramic wavelength converting structures, that may be formed by sintering or any other suitable process; wavelength converting materials such as powder phosphors that are disposed in transparent material such as silicone or glass that is rolled, cast, or otherwise formed into a sheet, then singulated into individual wavelength converting structures; and wavelength converting materials such as powder phosphors that are disposed in a transparent material such as silicone that is formed into a flexible sheet, which may be laminated or otherwise disposed over an LED 1.

Examples of wavelength converting structures that are formed in situ include wavelength converting materials such as powder phosphors that are mixed with a transparent material such as silicone and dispensed, screen printed, stenciled, molded, or otherwise disposed over LED 1; and wavelength converting materials that are coated on LED 1 by electrophoretic, vapor, or any other suitable type of deposition.

Multiple forms of wavelength converting structure can be used in a single device. As just one example, a ceramic wavelength converting member can be combined with a molded wavelength converting member, with the same or different wavelength converting materials in the ceramic and the molded members.

The wavelength converting structure 30 includes a wavelength converting material as described above, which may be the only wavelength converting material in the wavelength converting structure, or one of multiple wavelength converting materials in the wavelength converting structure. The wavelength converting structure 30 may also include, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce.

The wavelength converting material absorbs light emitted by the LED and emits light of one or more different wavelengths. Unconverted light emitted by the LED is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light extracted from the structure.

In some embodiments, a wavelength converting material as described above is formed into a ceramic, for example by sintering or any suitable method. Such a luminescent ceramic may replace garnet-based luminescent ceramics due to the expected lower thermal quenching of the above-described nitride ceramics in, for example, products requiring cool white light such as automotive products. In some embodiments, the presence of CaO in the above-described wavelength converting materials allows the use of significantly lower sintering temperatures, as compared to, for example, materials disclosed in US 2013/0234588 or some garnet-based luminescent ceramics. For example, in some embodiments, the firing temperature can be reduced from 1750° C. to only 1600° C. A specific advantage of this lowering of the firing temperature is that dense ceramics can be sintered under reduced nitrogen pressure without partial decomposition. In some embodiments, sintering is being carried out under ambient pressure. A reduced nitrogen pressure accelerates the removal of porosity during sintering and therefore reduces processing time. To improve properties of the sintered ceramics like light transmission or mechanical strength, a sintering step under reduced nitrogen pressure may be followed by an annealing step under increased pressure. The sinterability of the claimed material can further be enhanced by replacing part of the nitrogen gas atmosphere by hydrogen or helium. For example, in some embodiments, sintering is carried out in a $H_2/N_2$ 5/95% v/v gas mixture.

Multiple wavelength converting materials may be mixed together or formed as separate structures.

In some embodiments, a blue-emitting LED is combined with a yellow-to-green emitting luminescent ceramic comprising a wavelength converting material as described above, and with a red-emitting wavelength converting material. Light from the LED, the luminescent ceramic, and the red-emitting wavelength converting material combine such that the device emits light that appears white. Hence, in embodiments the wavelength converting material is a first wavelength converting material that emits light having a peak wavelength that is yellow or green, the device further comprising a second wavelength converting material that emits light having a peak wavelength that is red. In specific embodiments, R comprises La; A comprises Ca; the material comprises Ce and/or Eu; and ([La]+[Ca]+[Ce]+[Eu])/[Si] ≤0.52.

In some embodiments, other materials may be added to the wavelength converting structure, such as, for example, materials that improve optical performance, materials that encourage scattering, and/or materials that improve thermal performance.

EXAMPLE 1

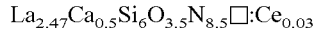
$La_{2.47}Ca_{0.5}Si_6O_{3.5}N_{8.5}\square:Ce_{0.03}$ 20.3 mg $LaF_3$, 20.1 mg $La(NH_2)_3$, 35.6 mg $Si(NH)_2$, 20 mg $CaH_2$ and 0.5 mg $CeF_3$ (1.2 mol % La) are mixed and fired in a tungsten crucible under dry nitrogen at 1600° C. for 10 hrs. Oxygen was introduced via $La(NH_2)_3$. After cooling down the yellow powder is crushed and screened. FIG. 6 illustrates the excitation 40 and emission 42 spectra of the material of example 1. The peak excitation wavelength is 440 nm, x=0.471, y=0.510, luminous efficiency (LE) is 385 lm/$W_{opt}$, quantum efficiency is 0.620, and peak emission wavelength is 565 nm (yellow-green). Luminous efficiency of radiation (unit lumens per watt) is a measure for the brightness of a light source if sensed by the human eye.

EXAMPLE 2

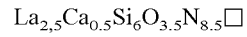
$La_{2.5}Ca_{0.5}Si_6O_{3.5}N_{8.5}\square$ 20.3 mg $LaF_3$, 20.1 mg $La(NH_2)_3$, 35.6 mg $Si(NH)_2$ and 20 mg $CaH_2$ are mixed and fired in a tungsten crucible under dry nitrogen at 1600° C. for 10 hrs. After cooling down the colorless powder is crushed and screened.

EXAMPLE 3

Figure 7:
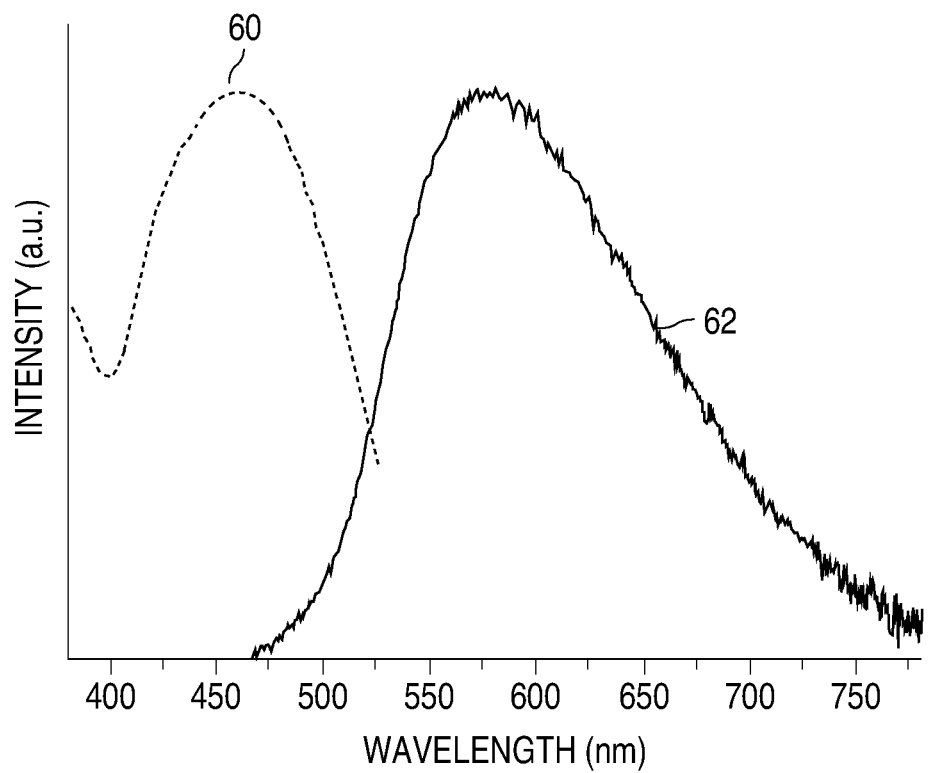

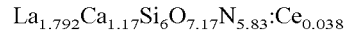
$La_{1.792}Ca_{1.17}Si_6O_{7.17}N_{5.83}:Ce_{0.038}$ 23.2 mg $LaCl_3$, 100 mg $Si_2(NH)_3 \times 6\ NH_4Cl$, 20.1 mg $CaH_2$ and ×0.4 mg $CeF_3$ (2.1 mol % La) are mixed and fired in a tungsten crucible under dry nitrogen at 1600° C. for 10 hrs. After cooling down, the resulting yellow powder is crushed, screened and washed with water. FIG. 7 illustrates the excitation 60 and emission 62 spectra of the material of example 3. The peak excitation wavelength is 440 nm, x=0.489, y=0.495, LE is 352 lm/$W_{opt}$, quantum efficiency is 0.460, and peak emission wavelength is 581 nm (yellow).

EXAMPLE 4

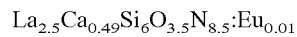
$La_{2.5}Ca_{0.49}Si_6O_{3.5}N_{8.5}:Eu_{0.01}$ 20.3 mg $LaF_3$, 20.1 mg $La(NH_2)_3$, 35.6 mg $Si(NH)_2$, 20 mg $CaH_2$ and ×1.9 mg $EuF_3$ (1.9 mol % Ca) are mixed and fired in a tungsten crucible under dry nitrogen at 1600° C. for 10 hrs. After cooling down the orange powder is crushed and screened.

EXAMPLE 5

Figure 8:
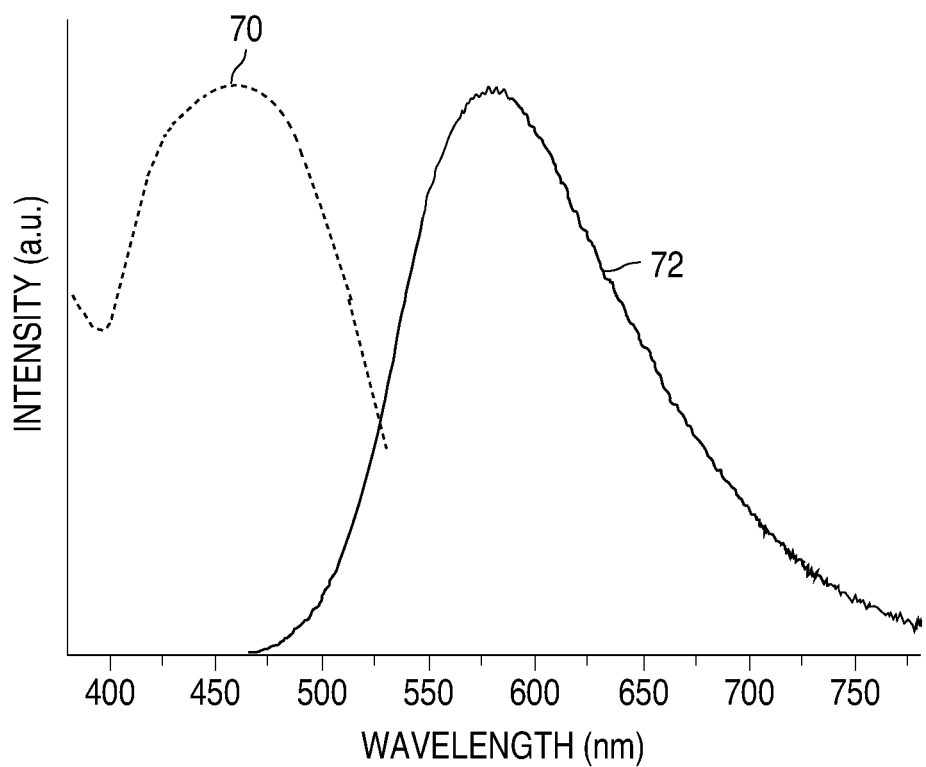

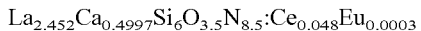
$La_{2.452}Ca_{0.4997}Si_6O_{3.5}N_{8.5}:Ce_{0.048}Eu_{0.0003}$ 40.6 mg $LaF_3$, 40.2 mg $La(NH_2)_3$, 71.2 mg $Si(NH)_2$, 40 mg $CaH_2$, 1.6 mg $CeF_3$ (1.9 mol % La) and 0.1 mg $EuF_3$ (0.05 mol % Ca) are mixed and fired in a tungsten crucible under dry nitrogen at 1600° C. for 10 hrs. After cooling down the orange powder is crushed and screened. FIG. 8 illustrates the excitation 70 and emission 72 spectra of the material of example 6. The peak excitation wavelength is 440 nm, x=0.491, y=0.495, LE is 367 lm/$W_{opt}$, quantum efficiency is 0.636, and peak emission wavelength is 578 nm (yellow).

EXAMPLE 6

Figure 9:
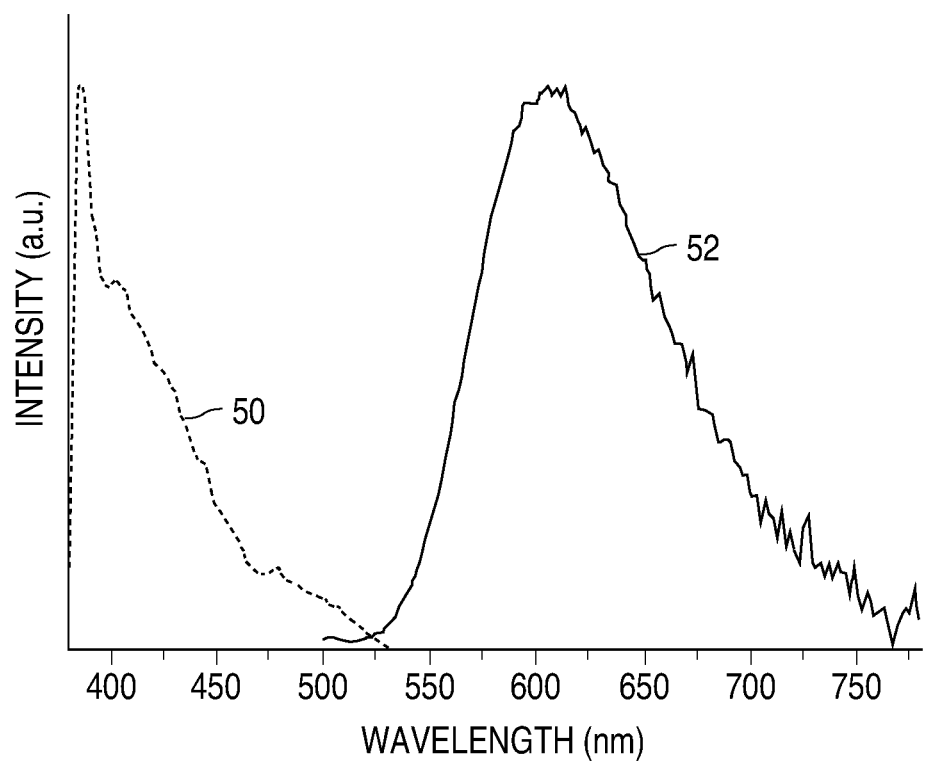

$La_{1.83}Ca_{1.165}Si_6O_{7.17}N_{5.83}:EU_{0.005}$ 23.2 mg $LaCl_3$, 100 mg $Si_2(NH)_3 \times 6\ NH_4Cl$, 20.1 mg $CaH_2$ and ×0.4 mg $EuF_3$ (0.4 mol % Ca) are mixed and fired in a tungsten crucible under dry nitrogen at 1600° C. for 10 hrs. After cooling down, the resulting yellow powder is crushed, screened and washed with water. FIG. 9 illustrates the excitation 50 and emission spectra of a crystallite of the material of Example 7. The emission wavelength range is 530-780 nm, x=0.585, y=0.414, LE is 276 lm/W$_{opt}$, full width half maximum (FWHM) is 109.7 nm, and peak emission wavelength is 608 nm (orange).

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The term "substantially" herein, such as in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to". The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A wavelength converting material comprising $R_{3-x-y-z}A_{x+y}M_zSi_{6-w1}Al_{w1}O_{3x+y+w1}N_{11-7x/3-y-w1}\square_{2-2x/3}$,
the wavelength converting material comprising a crystal lattice;
$\square$ representing a vacancy in the crystal lattice;
$0<x\leq3$;
$-3\leq y<3$;
$0<z<1$;
$0\leq w1\leq6$;
$0\leq x+y$, $x+y+z\leq3$;
$11-7/3x-y-w1\geq0$;
$3x+y+w1\leq13$;
R is selected from a group trivalent La, Gd, Tb, Y, and Lu;
A is selected from a group bivalent Ca, Mg, Sr, Ba, and Eu;
M is selected from a group trivalent Ce, Pr and Sm;
at least one of the vacancies $\square$ occupied by an O atom,
[La]>0,
[Ca]>0,
$0\leq[Eu]\leq0.01$, and
$([La]+[Ca]+[Ce]+[Eu])/[Si]\leq0.52$.

2. The wavelength converting material according to claim 1, wherein the wavelength converting material comprises SiAlON.

3. The wavelength converting material according to claim 1, wherein $R=La_a(Y_bLu_{1-b})_{1-a}$, where $a\geq0.5$, $0\leq b\leq1$.

4. The wavelength converting material according to claim 1, further comprising Y and Sr.

5. The wavelength converting material according to claim 1, wherein no more than 5% of Si is replaced by Al.

6. The wavelength converting material according to claim 1, further comprising La, Ca, and O.

7. A device comprising:
a light emitting diode that emits blue light; and
a wavelength converting material according to claim 1 disposed in a path of the blue light.

8. The device according to claim 7 wherein:
the wavelength converting material comprises Ce; and
$([La]+[Ca]+[Ce])/[Si]\leq0.52$.

9. The device according to claim 7, wherein the wavelength converting material is a first wavelength converting material that emits light having a peak wavelength that is yellow or green, the device further comprising a second wavelength converting material that emits light having a peak wavelength that is red.

* * * * *